United States Patent [19]

Larson

[11] Patent Number: 4,524,326

[45] Date of Patent: Jun. 18, 1985

[54] DIGITALLY-DRIVEN SINE/COSINE GENERATOR AND MODULATOR

[75] Inventor: Michael E. Larson, Fond du Lac, Wis.

[73] Assignee: AMCA International Corp., Fond du Lac, Wis.

[21] Appl. No.: 401,008

[22] Filed: Jul. 22, 1982

[51] Int. Cl.$^{3}$ ...................... H03B 19/00; H03K 13/02

[52] U.S. Cl. ...................................... 328/14; 307/529; 377/42; 328/142

[58] Field of Search .................. 328/14, 142; 307/529; 340/347 DA, 347 M; 377/42

[56] References Cited

U.S. PATENT DOCUMENTS

| | | | |
|---|---|---|---|
| 3,134,098 | 5/1964 | Herzl | 340/347 M |
| 3,500,213 | 3/1970 | Ameau | 328/14 |
| 3,569,684 | 3/1967 | Burnett | 235/152 |
| 3,706,855 | 12/1972 | Pitroda et al. | 179/18 ES |
| 3,728,719 | 4/1973 | Fish | 340/347 DA |
| 3,838,414 | 9/1974 | Wiles | 340/347 DA |
| 3,863,158 | 1/1975 | Kupersmith et al. | 328/14 |
| 3,974,498 | 8/1976 | Knier | 340/347 M |
| 3,992,680 | 11/1976 | Herzl | 328/14 |
| 4,061,909 | 12/1977 | Bryant | 328/14 |
| 4,368,432 | 1/1983 | Levy | 328/14 |
| 4,409,555 | 10/1983 | Min et al. | 307/529 |

OTHER PUBLICATIONS

S. G. Pitroda, "Digital Concepts in Service Circuits," *GTE Automatic Technical Journal,* Apr. 1973, pp. 315–322.

S. G. Pitroda, "Multifrequency (MF) Tone-Generating System for a Pulse-Code-Modulation (PCM) Digital Exchange,38 *IEEE Trans. Comun. Technol.,* vol. Com-19, No. 5, Oct. 1971, pp. 588–596.

S. G. Pitroda and R. L. Lindsay, "Progress Tones in PCM Switching Environment", *IEEE Trans. Commun.,* Dec. 1973, pp. 1431–1434.

Tietze & Schenk, *Advanced Electronic Circuits,* Springer Verlag, 1978, pp. 411–412, 424–426.

P. L. McGuire, "Digital Pulses Synthesize Audio Sine Waves," *Electronics,* vol. 48, No. 20, pp. 104–105.

*Primary Examiner*—John S. Heyman

*Attorney, Agent, or Firm*—Leydig, Voit, Osann Mayer & Holt, Ltd.

[57] ABSTRACT

An electrical circuit and method for multiplying an analog input signal by a sinusoidal function having an instantaneous phase specified by a number signaled in binary format. As a sine wave generator, the binary number is supplied by a counter clocked at a multiple of the desired sine wave frequency. The most significant bit of the counter modulates the polarity of or actually constitutes the analog input signal which is then fed to a numerically-controlled attenuator driven by the less significant binary counter outputs. The attenuator has selectively switched resistors with values specifying a sine table of attenuation from 0 to 90 degrees. A particular resistor is selected by an analog multiplexer having paired complementary outputs so that over the range of less significant bit values, a full 180 degrees of the sinusoid is generated. As a sine wave modulator, the polarity of the analog input signal is modulated in a balanced modulator by the most significant bit of the counter, and the balanced modulator output is used as the input to the attenuator.

14 Claims, 10 Drawing Figures

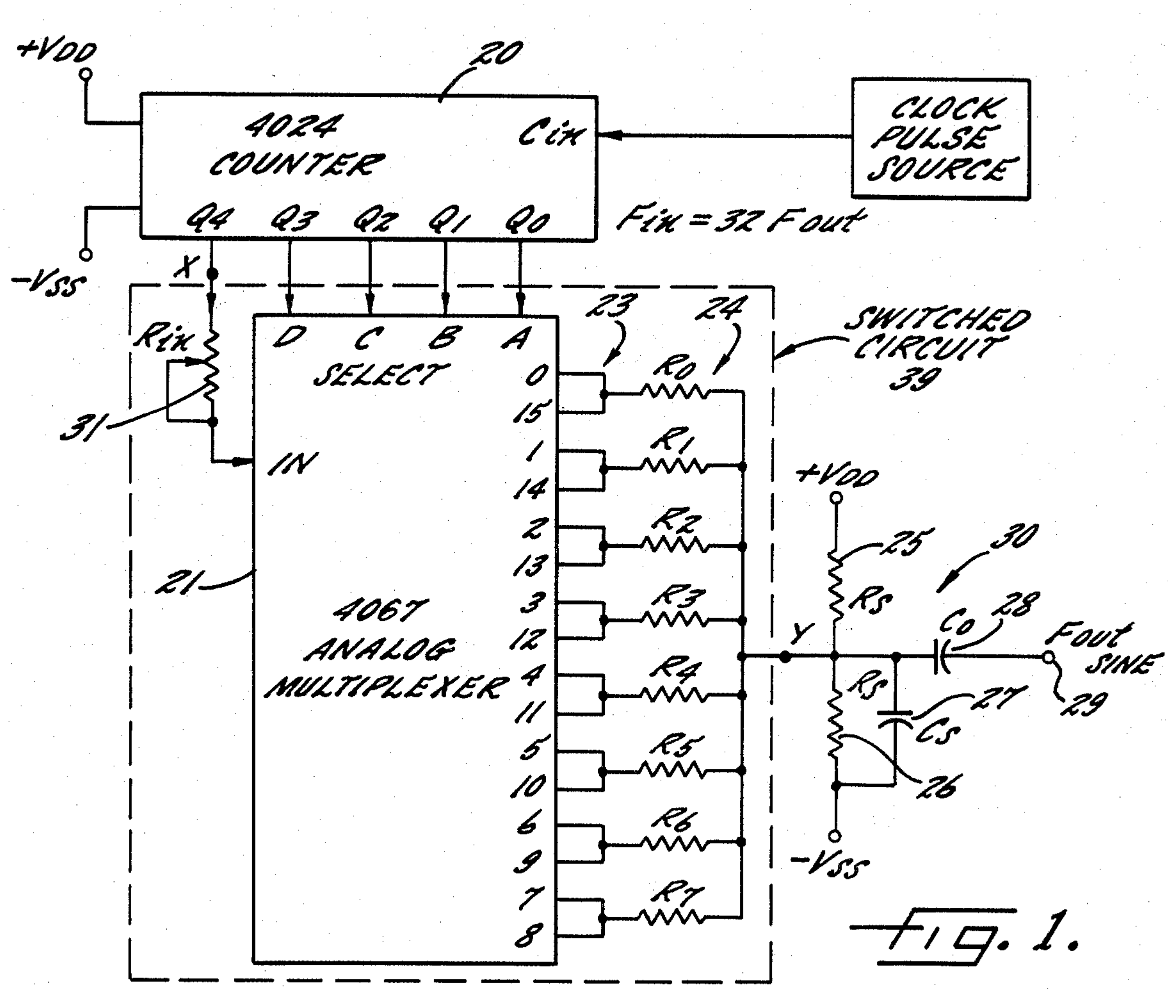
FIG. 1.
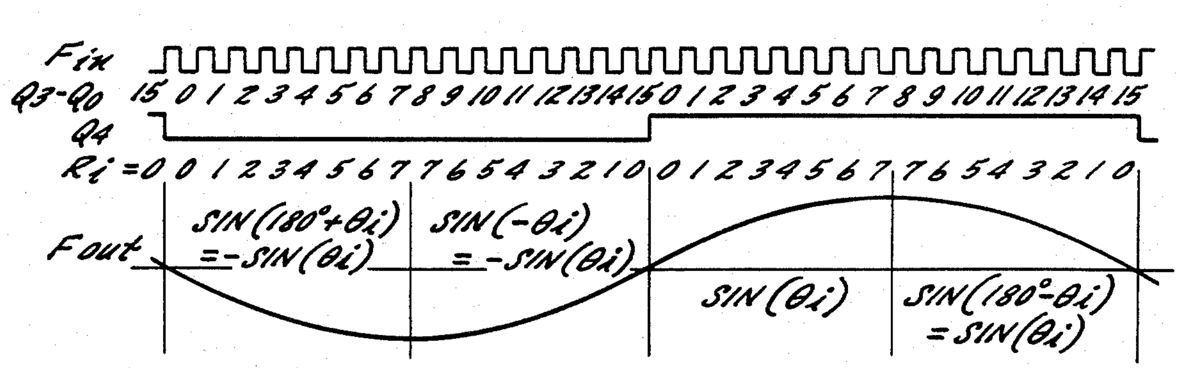
FIG. 2.
| $i$ | $(2i+1)$ | $\theta_i=(90°/16)(2i+1)$ | $\sin\theta_i$ | $(\sin\theta_i)^{-1}$ | $(\sin\theta_i)^{-1}-1$ |
|---|---|---|---|---|---|
| 0 | 1 | 5.625 | 0.09801 | 10.2023 | 9.2023 |
| 1 | 3 | 16.875 | 0.29028 | 3.4449 | 2.4449 |
| 2 | 5 | 28.125 | 0.47140 | 2.1214 | 1.1214 |
| 3 | 7 | 39.375 | 0.63439 | 1.5763 | 0.5763 |
| 4 | 9 | 50.625 | 0.77301 | 1.2936 | 0.2936 |
| 5 | 11 | 61.875 | 0.88192 | 1.1339 | 0.1339 |
| 6 | 13 | 73.125 | 0.95694 | 1.0450 | 0.0450 |
| 7 | 15 | 84.375 | 0.99518 | 1.0048 | 0.0048 |
FIG. 3.

DIGITALLY-DRIVEN SINE/COSINE GENERATOR AND MODULATOR

BACKGROUND OF THE INVENTION

1. Field of the Invention

This invention relates generally to sine wave generators, doubly balanced modulators, and multiplying type digital-to-analog converters. Specifically, the invention relates to means for generating a sine wave having a phase specified by a digital input, and means for multiplying the sinusoidal signal by an analog signal. In one advantageous application, the invention may be employed to supply quadrature sine and cosine sinusoidal signals for excitation of resolvers, Inductosyn devices or the like.

2. Background Art

A conventional method of generating a sinusoid signal from a digital source and multiplying the resultant sine wave by an analog signal is to use a multiplying digital-to-analog converter such as Analog Devices Part Number 7541 which comprises a conventional R/2R ladder network and CMOS transmission gates switching in the ladder rungs. The analog output of the digital-to-analog converter is scaled by the analog input exciting the ladder network. But since such a digital-to-analog converter is a linear device, the non-linear function of generating the sine wave must be programmed, for example in a look-up sine table. Thus, execution of the software functions in a conventional system, such as a microcontroller, requires considerable time and also consumes an output port.

SUMMARY OF THE INVENTION

The general aim of the invention is to generate a sinusoidal function having an amplitude set by an analog input signal and having an instantaneous phase specified by a digital input.

Thus, a specific objective of the invention is to generate a sine wave synchronized to a phase number on the outputs of a digital counter.

Another object of the invention is to provide a doubly-balanced sine wave modulator having a numeric phase input.

Moreover, it is an object of the invention to provide a sine wave and a cosine wave both referenced to the same digital phase input with a minimum of phase error.

In accordance with the invention, a set of resistors have resistance values that comprise a sine function table. An analog multiplexer converts the digital phase input to corresponding sinusoidal magnitudes by selecting the required resistor value corresponding to the numerical phase input. The selected resistor is switched into an attenuator circuit so that the analog multiplexer in effect performs a high speed parallel mode non-linear digital-to-analog conversion. The conversion from the digital phase input to the analog sine function occurs at a high speed set by the switching time of a single analog transmission gate. The analog multiplexer has paired complementary outputs so that 180° of the sine function is generated by a set of resistance values for phases from 0° to 90°. Moreover, a full 360 degrees of phase is obtained by using the most significant bit of the phase number as the input to the attentuator, or alternatively using the most significant bit of the phase number as the digital input to a balanced modulator that is in series with the attenuator and accepts an analog amplitude reference level on its balanced input.

Since the phase input is a digital signal, it is generated conveniently by a binary counter having a clock input and a reset input. Then the frequency is a submultiple of the clock input frequency and thus may be easily controlled. The phase is referenced to a zero phase by activating the counter reset input. In addition, a plurality of sine/cosine generators and modulators may be combined together with the reset input of one generator activated by a particular state of a master counter on another sine/cosine generator, so that multiple phase sinusoidal wave forms are obtained.

BRIEF DESCRIPTION OF THE DRAWINGS

Other objects and advantages of the invention will become apparent upon reading the following detailed description and upon reference to the drawings in which:

FIG. 1 is a schematic diagram of an exemplary embodiment according to the invention for generating a sign wave at a submultiple of a digital input clock frequency;

FIG. 2 is a timing diagram which illustrates the circuit in FIG. 1;

FIG. 3 is a table of attenuator gain and resistance values to obtain a sinusoidal output signal from the circuit in FIG. 1;

Figure 4:
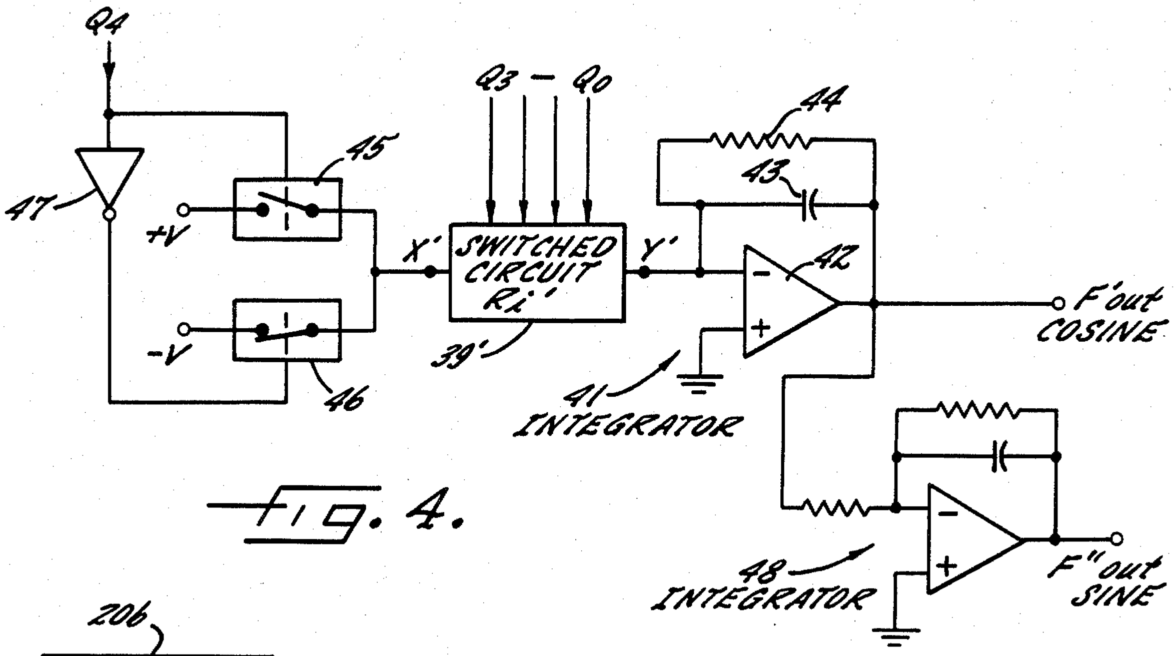
FIG. 4 is an alternative embodiment of the present invention using an integrator type attenuator and further comprising an integrator phase shifter so that both sine and cosine outputs are obtained and further including a balanced switching modulator for amplitude modulating the output sinusoids by an analog input reference level.

While the invention is susceptible to various modifications and alternative forms, specific embodiments thereof have been shown by way of example in the drawings and will herein be described in detail. It should be understood, however, that they are not intended to limit the invention to the particular forms disclosed, but, on the contrary, the intention is to cover all modifications, equivalents, and alternatives falling within the spirit and scope of the invention as defined by the appended claims.

DESCRIPTION OF THE PREFERRED EMBODIMENTS

Turning now to the drawings, FIG. 1 shows an electronic schematic of a sine wave generator according to the present invention. A binary counter 20, typically CMOS No. 4024, accepts input clock pulses $F_{in}$ at 32 times the desired output frequency $F_{out}$ and generates a binary number on its five output lines $Q_4$–$Q_0$ that cycles through thirty-two values 0–31. $Q_4$ designaties the most significant bit while $Q_0$ designates the least significant bit. The four least significant bits $Q_3$–$Q_0$ (which signal a "magnitude" number varying from 0–15 at a count cycle frequency of $F_{in} \div 16$) are fed to the select inputs A, B, C, D of a one-of-sixteen analog multiplexer 21 typically CMOS part number 4067 such as RCA Corp. part number 4067B. The most significant bit $Q_4$ is used as the multiplexer input signal X which is fed through an adjustable series resistor $R_{in}$ to the multiplexer input IN. The input signal at X (and at IN) is a square wave with alternate high and low half cycles and a frequency equal to $F_{in} \div 32$. The multiplexer outputs are labeled 0 through 15, with the labeled outputs corresponding to and enabled by the binary select number fed in binary form to the inputs A, B, C, D. When a given output is enabled the input signal IN is fed to that particular output. The voltage at that particular output follows the voltage of the input signal with a small error. The multiplexer outputs 0–15 are, however, paired in a full-scale complementary fashion. As shown in FIG. 1, the sum of the values of the two binary select numbers for each pair of outputs adds up to the total number of output lines minus 1. In terms of the binary number on the select lines A–D, the paired select numbers in binary are 1's complement of each other. The paired outputs are connected to series attenuator resistors, generally designated 24, having resistance values $R_0$–$R_7$. The attenuator resistors, in conjunction with load resistors 25 and 26 of value $R_s$, form an attenuator generally designated 30. The multiplexer 21, in combination with the attenuation resistors 24, form a "switched circuit" 39 selecting a particular one of the attenuation resistors as the attenuator resistor in series with the input X and the load resistors 25, 26. Each of the attenuation resistors 24 is a gain-setting circuit. Thus the attenuator 30 is digitally-controlled by the binary magnitude number on the select inputs A–D fed by the binary outputs $Q_0$–$Q_3$ of the binary counter 20. The output of the attenuator 30 also includes a smoothing or low-pass filtering capacitor 27 of value $C_s$ and a coupling capacitor 28 of value $C_o$. $C_s$ should be chosen as a fraction of $1/(2\pi F_{out} R_s)$, and $C_o$ should be at least a few times larger.

The reader will understand, after considering the following functional description and design constraints, that a sine wave $F_{out}$ appears on the output node 29. The polarity of the signal on the output node 29 is the polarity of the signal at X, since when a particular one of the resistors $R_0$–$R_7$ is selected by the multiplexer 21, the resulting attenuator circuit is passive, the output signal being the input signal scaled by a positive gain factor G of the attenuator. Similarly, the gain factor G, set by the particular one of the resistors selected by the multiplexer, specifies the absolute value or instantaneous magnitude of the signal on the output node 29, since the instantaneous magnitude of the excitation signal at X is constant, being equal to $\frac{1}{2}(V_{DD}-V_{SS})$. For a sinusoid, the polarity alternates once in each cycle while the absolute value or instantaneous magnitude is repeated, the same absolute value occurring once for positive polarity and once again, 180 degrees later, for negative polarity. The multiplexer input IN is excited by the most significant bit $Q_4$. Thus the polarity of the attenuator output signal $F_{out}$ alternates once for a full cycle of 32 counts of the counter 20 as specified by the logic level of $Q_4$. Also, the select lines A, B, C, D of the multiplexer 21 are activated by the least significant bits $Q_3$–$Q_0$ of the binary counter 20. Thus the same absolute value or instantaneous magnitude occurs at least once for each polarity, as determined by $Q_3$–$Q_0$, since $Q_3$–$Q_0$ specifies a magnitude number incremented from 0 to 15 once for $Q_4$ being a logical 0 and once again for $Q_4$ being a logical 1.

Moreover, a sinusoid has even symmetry about its maxima and minima, so that the same absolute value or instantaneous magnitude actually occurs four times for each cycle, or twice for each polarity. Thus out of the sixteen values specified by $Q_3$–$Q_0$, there are only eight unique absolute values or instantaneous magnitudes. The multiplexer outputs labeled 0–15 are paired in full-scale complementary fashion to take advantage of the even symmetry of a sinusoid about its maxima and minima, and thus only eight resistors $R_0$–$R_7$ rather than sixteen are required to set the instantaneous magnitudes associated with the sixteen values specified by $Q_3$–$Q_0$.

To generate a stair-step output at node Y which is easily smoothed by the filtering capacitor 27 to precise sinusoidal form at the output 29, the resistors $R_0$–$R_7$ are chosen in their respective values to make the effective attenuation factor or gain G proportional to the magnitude of a sine wave at equally-spaced phase angles over the span of a quarter-cycle. If the active one of the resistors $R_0$–$R_7$ is designated by an index i and symbolized $R_i$, one sees that i changes from 0 to 7 twice as the select number signaled at A, B, D, C changes from 0 to 15.

FIG. 2 illustrates the input or clock signal $F_{in}$ and the resulting cycling count represented at the counter terminals $Q_3$–$Q_0$ (and thus at the select terminals D, C, B, A). The $Q_4$ signal is shown to change levels at the completion of each $Q_3$–$Q_0$ cycle. The index i (identifying the active one of the resistors $R_0$–$R_7$) is also shown as reflecting the pairing of resistors, i.e., to scan upwardly during half the $Q_3$–$Q_0$ cycle and downwardly during the ensuing half. This means, as explained below, that the attenuation gain G increases in steps over a quarter-cycle of the sinusoidal $F_{out}$ and then decreases in steps over the next quarter-cycle, polarity reversal of that sinusoid occuring at the half-cycle mark due to the change in $Q_4$.

The numerical value of the select signals D, C, B, A specifies a phase number having sixteen discrete values 0 to 15, the first half wave of the sinusoid is divided up into sixteen discrete phase points spaced by 180°/16=11.25°. The first such point occurs, however, at the 5.625° phase point on the $F_{out}$ sinusoid. One may express the instantaneous phase angle $\theta_i$ in degrees for the first quarter wave of the sinusoid (for any state of the select number D, C, B, A from 0 to 7 corresponding to the index i) by the equation:

$$\theta_i = \frac{90^\circ (2i + 1)}{16}$$

for the particular example of a sixteen state selector and eight switched resistors. The pairing of multiplexer outputs and the use of eight resistors $R_0$-$R_7$ results in the index i scanning up and then down, so that the same one of those resistors is active at points phased equally but oppositely from the maxima and minima of the $F_{out}$ sine wave. In general, the binary number $N=[Q_4, Q_3, Q_2, Q_1, Q_0]$ specifying the state of the counter 20, ranging from 0 to 31, specifies an instantaneous phase $\theta_N$ on the sine wave, ranging between $-180°$ and $+180°$; according to:

$$\theta_N = \frac{90°\,(2N+1)}{16} - 180°$$

FIG. 3 shows for $i=0$ to 7 the values of $\theta_i$ and $\sin\theta_i$ over the span of 90° on the output sinusoid $F_{out}$. The ohmic values of the resistors $R_0$-$R_7$ are correlated to those $\sin\theta_i$ values to make the switched circuit 39 produce at node Y the voltages which are points on a sine function whose amplitude is the magnitude of the signal at X. One solves for the desired value of any resistor $R_i$ by reference to the necessary attenuator gain $G_i$ for the corresponding value of $\theta_i$ and $\sin\theta_i$. For the exemplary circuit of FIG. 1, and assuming for the moment that the resistor 31 has a value $R_{in}$ of zero, the attenuator gain is:

$$\left(\frac{E_y}{E_x}\right)_i = G = \frac{\frac{1}{2}R_s}{R_i + \frac{1}{2}R_s}$$

Thus the value of any resistor $R_i$ is expressed, by solving the above equation for $R_i$, as $$R_i = \frac{1}{2}R_s\left(\frac{1}{G_i} - 1\right)$$

Since the gain G (i.e., the attenuation factor) is to be made equal to $\sin\theta_i$ at each point, then the value of each resistor $R_i$ is determined relative to the value chosen for $R_s$ by the equation:

$$R_i = \frac{R_s}{2}\left[\frac{1}{\sin\theta} - 1\right] = \frac{R_s}{2}\,[(\sin\theta_i)^{-1} - 1]$$

FIG. 3 shows the eight values of $(\sin\theta)^{-1}$ and in the right column the values of the resistors $R_i$ in K ohms—based upon the assumption that $R_s$ is 2K ohms and $\frac{1}{2}R_s$ is 1K ohms.

It should be noted that the sine wave is generated by the relative weights of the resistors $R_i$, that is the ratio of resistance of one resistor to the next resistor, so that the internal resistance of the transmission gates in the multiplexer 21 may be a problem. In practice, the transmission gates are matched in resistance so that a single compensation resistor in series with all of the transmission gates may compensate for the variation in internal resistance of the transmission gates. As shown in FIG. 1, a variable resistor 31 is inserted in series with the input IN of the multiplexer 21. The maximum resistance $R_{in}$ of the variable resistor 31 is selected to be greater than the maximum internal resistance that the transmission gates could have. Then the variable resistor 31 is adjusted so that its resistance plus the transmission gate resistance adds up to the maximum limit value. Then the values of the resistors $R_0$-$R_7$ are determined by subtracting this limit value of resistance from the desired attenuator resistor values in the last column of the table in FIG. 3.

Now that the circuitry in FIG. 1 has been described in detail, it will be understood that the advantagous functions carried out by the invention may be obtained by apparatus which departs from the details of the particular circuitry described. The counter 20 may alternatively be an accumulator register in a microprocessor which is periodically incremented or decremented to give a changing binary number N specifying the instantaneous sinusoid phase $\theta_N$. Certainly, a counter having more or less than five output bits may be used instead of a five stage counter if a multiplexer having a corresponding number of select and output lines selecting a corresponding number of resistors is used. A four stage counter, for example, requires a multiplexer with eight output lines paired to select four attenuator resistors. In general, if an M stage binary counter is used, the instantaneous phase of the sinusoid is specified by an M bit binary number on the M counter outputs. The M bit binary number will have a most significant bit and $M-1$ less significant bits, the $M-1$ less significant bits specifying an $M-1$ bit magnitude number Z. An $M-1$ line multiplexer is needed having its select inputs accepting the $M-1$ less significant counter bits. The multiplexer outputs are then paired so that each magnitude number Z, being the multiplexer select number, selects the same output line as the magnitude number $\overline{Z}$, where $\overline{Z}$ designates the binary one's complement of Z. The intantaneous phase $\theta$ is then a function of M and Z according to:

$$\theta = \frac{90°\,(2Z+1)}{2^{(M-1)}}$$

Consequently, to generate a simusoid having the instantaneous phase $\theta$, the gain G must be proportional to sin $\theta$, or in mathematical terms, $$G \propto \sin\theta$$

The gain G is made a function of $\theta$ by connecting the $2^{(M-2)}$ pairs of multiplexer outputs to respective $2^{(M-2)}$ attenuation resistors, each resistor being one of $2^{(M-2)}$ gain-setting circuits selecting values of approximately sinusoidal attenuation gain G in the attenuator signal path over a quarter-cycle phase interval of 90 degrees. Then the quarter-cycle phase interval is specified by magnitude numbers Z ranging from 0 to $2^{(M-2)}-1$, selecting the $2^{(M-2)}$ attenuation resistors in succession.

The binary number N need not be uniformly incremented or decremented, and in fact for phase locking functions the rate at which the counter is incremented or decremented may be variable so that the counter is in effect a number-controlled oscillator. Similarly, the rate at which the counter 20 in FIG. 1 is incremented may be varied by using a variable source of input frequency $F_{in}$ such as a voltage-controlled oscillator. Although the multiplexer in FIG. 1 has 16 output lines, each having a transmission gate from the input IN, the function performed by the multiplexer 21 having its complementary outputs paired, could be performed by only 16 transmission gates with each gate being activated by the respective select input number or its complement. The multiplexer 21 in FIG. 1 is a device having decoding logic and transmission gates. Alternatively, a counter with decoded outputs could be used and OR gates could combine the complementary decoded outputs to activate individual transmission gates. In its broadest aspects, the counter and multiplexer combination is a means for cyclically switching the sinusoidally weighted resistors 24 into the attenuator's signal path so that switching upon complementary counter states exploits the even symmetry of the sine wave about its maxima and minima. Moreover, the full-scale complementary pairing may pair the binary 2's complement rather than the binary 1's complement. In FIG. 1 the multiplexer line 0, for example, could be left unconnected, while lines 1 and 15 are paired and select resistor $R_0$, lines 2 and 14 are paired and select resistor $R_1$, . . . , lines 7 and 9 are paired and select resistor $R_6$, and line 8 by itself selects $R_7$. In this example, the paired select numbers, specified by the logic levels on the multiplexer 21 select lines A–D, are binary 2's complement of each other. Persons skilled in the art will recognize that the substitution of the 2's complement for the 1's complement results in a phase shift; the phase $\theta_i$ in degrees for the first quarter wave of the sinusoid is then a function of the index i of resistors $R_0$–$R_7$ according to:

$$\theta_i = \frac{90^\circ\,(2i)}{16}$$

and similarly the phase $\theta_N$ in degrees of the sinusoid, ranging between $-180°$ and $+180°$ as a function of the binary state N of the counter 20, $N=[Q_4, Q_3, Q_2, Q_1, Q_0]$, is given by:

$$\theta_N = \frac{90^\circ\,(2N)}{16} - 180^\circ$$

Thus the applicant intends "full-scale complementary pairing" to encompass both 2's and 1's complement pairing, the sum of the paired select numbers being either the number of multiplexer output lines or the number of multiplexer ouput lines minus one.

It is also apparent to persons skilled in the art that the values of the resistors $R_0$–$R_7$ could be slightly modified to depart from a pure sine function to generate a distorted sinusoid if a distorted rather than a pure sinusoidal function might be needed in a particular application.

It should be noted that the invention may use any attenuator circuit which has an input and a variable impedance which attenuates the response of the circuit to the input. Of course, amplifiers with gains greater than 1.0 but weighted according to a sinusoidal pattern, may be used instead. Also, instead of a resistive voltage divider as in FIG. 1, an integrator with a variable current source may be used as shown in FIG. 4. The switched circuit 39' is a series element having a changeable resistance $R_i$ feeding an integrator generally designated 41 which performs a combined attenuation and smoothing or low pass filtering function. The integrator 41 is comprised of an operational amplifier 42, an integrating capacitor 43, and a feedback resistor 44 for DC biasing of the operational amplifier 42. Since the output of the integrator 41 is directly proportional to the input current and thus resistance $R_i'$, the different resistance values of the changeable resistance $R_i'$ should be inversely weighted with respect to sin $\theta_i$. These weights correspond to the second to the last column entries in FIG. 3.

The circuit in FIG. 4 also has input gates or switches 45 and 46 (e.g., CMOS part number 4016) for establishing an input reference $+V$, $-V$ independent of the voltage level on the most significant bit $Q_4$ of the FIG. 1 counter 20. The switches 45, 46 are oppositely driven as provided by inverter 47 driving the switch 46.

The circuit in FIG. 4 also has an integrator output section generally designated 48 for generating a sinusoid that lags the first sinusoid output by 90°. The first output $F'_{out}$ from the output of the op-amp 42 may thus be called a "cosine wave" with respect to the states of the counter 20, and the output $F''_{out}$ of the integrator 48 is a "sine wave" with respect to the counter 20. The sine/cosine relation of these two output signals makes them ideal for exciting resolvers, Inducto syn devices, or any apparatus requiring two sinusoid signals in phase quadrature.

Figure 5:
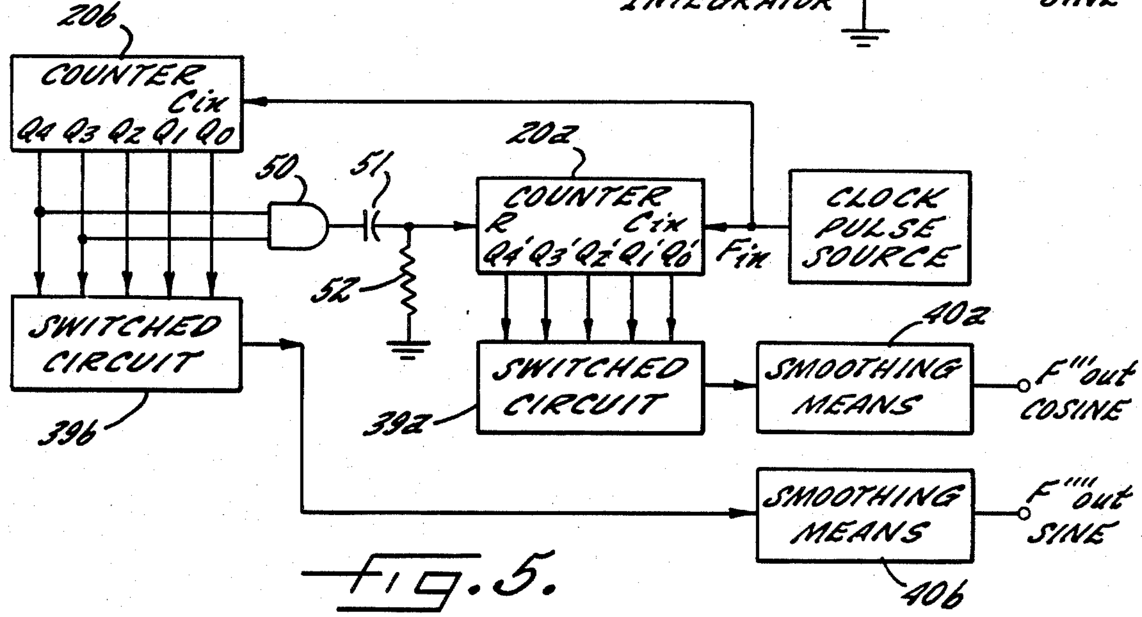
FIG. 5 is an alternative method of obtaining sine and cosine wave forms wherein two digitally-driven sinusoid generators are used, one of which has a reset input which is activated upon the occurrence of a particular phase of the other.

It should be noted that the use of an additional integrator as in FIG. 4 to generate quadrature sinusodial outputs has the disadvantage that the sinusoid outputs are not balanced and in fact may vary in phase with respect to each other because of component variations including phase shift due to the DC biasing of the integrator 48. Balanced outputs may be obtained by using two separate digitally-driven sinusoid generators, one of which has a counter which is reset upon the occurrence of a particular phase of the other binary counter, as illustrated in FIG. 5. If the counter 20*a* having the reset input R is reset upon the occurrence of the state 11000 of the other binary counter 20*b*, for example by using an AND gate 50 and a differentiator formed by a capacitor 51 and resistor 52, then the sinusoid generator (switched circuit 39*a* and smoothing means 40*a*) driven by the counter 20*a* will have a cosine wave $F_{out}'''$ and the sinusoid generator (switched circuit 39*b* and smoothing means 40*b*) driven by the counter 20*b* will have a sine wave $F_{out}''''$.

Figure 6:
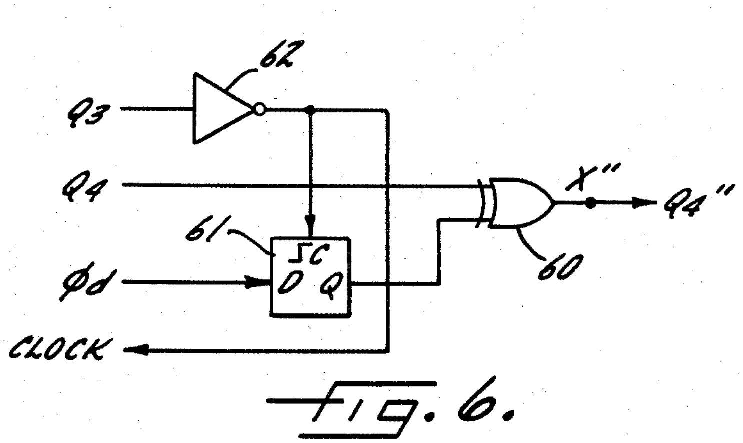
FIG. 6 is a schematic showing the addition of a binary phase modulator to the basic circuit according to the invention which includes means for synchronizing input data to the zero crossings of the sinusoid waveform.

For communications circuits, it is sometimes desirable to modulate the phase of a sinusoid by 0° or 180° depending on the state of an input data bit. For this purpose as shown in FIG. 6, the most significant binary counter output $Q_4$ is modulated by an exclusive-OR gate 60 to generate a phase modulated binary output $Q''_4$ for use in lieu of the output $Q_4$ applied to the switched circuits of FIGS. 1, 4 or 5. It is also desirable for the phase of the sinusoid to be reversed only at a zero crossing of the sinusoid. This is accomplished in FIG. 6 by delaying the input data bits $\phi_d$ by a D flip-flop latch 61 which is active upon the negative-going transition of the second most significant binary counter bit $Q_3$. The proper transition polarity is obtained by using an inverter 62 when the D flip-flop 61 is active upon a positive-going edge. The clock line to the D flip-flop 61 may be fed back to the data bit generating circuits to specify the required data rate.

Figure 7A:
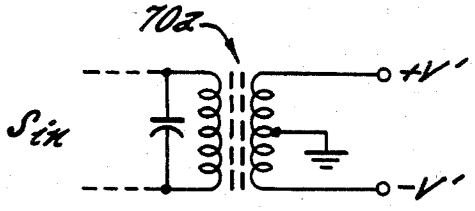
FIG. 7A is a schematic of a balanced IF transformer illustrating one means of obtaining a bipolar input signal.
Figure 7B:
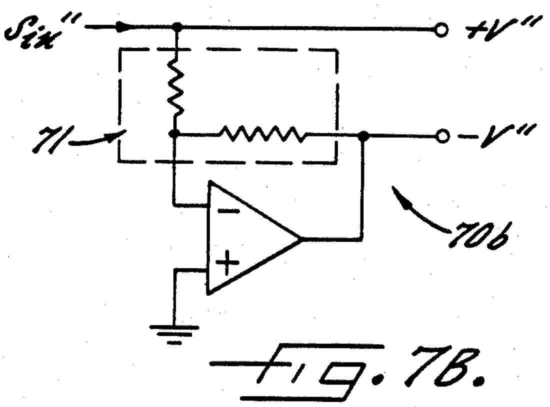
FIG. 7B is a schematic of a unity-gain inverter illustrating another means of obtaining a bipolar analog input signal.

The circuit in FIG. 4 may also function as a doubly-balanced sinusoidal modulator (i.e., a four-quadrant multiplier performing a multiplication by a sinusoid) by making an input analog signal $S_{in}$ create the reference voltages $+V$ and $-V$. In other words, the attenuator is placed in series with a balanced modulator, with the linear input of the balanced modulator accepting the analog signal $S_{in}$ and the other input of the balanced modulator accepting the most significant counter bit $Q_4$. A switching type balanced modulator, for example, may be obtained by adding a polarity reversing network as shown in FIG. 7A or FIG. 7B ahead of the input reference switches 45, 46 of the circuit in FIG. 4. The polarity reversing network in FIG. 7*a* uses a center-tapped IF transformer generally designated 70*a*, while the network in FIG. 7B uses a unity gain inverter generally designated 70*b* having a matched pair of resistors generally designated 71. Although a switching modulator is shown in FIG. 4, it is apparent to persons skilled in the art that the balanced modulator function could be performed by other types of balanced modulators such as diode ring modulators and differential amplifier type balanced modulators.

Figure 8:
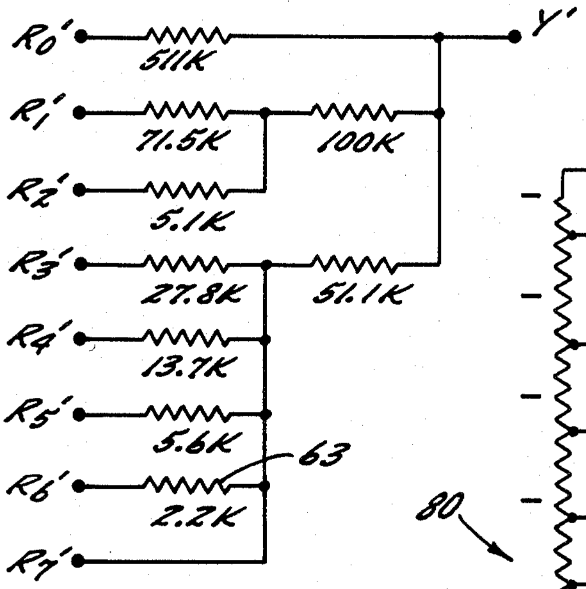
FIG. 8 is a tree diagram showing resistance values for obtaining attenuation impedances that are approximately the same while minimizing the effect of parts tolerance variation.

Comparing the circuit in FIG. 4 to the circuit in FIG. 1, it is observed that the values of the resistors $R_0$–$R_7$ in FIG. 1 are generally uniformily spread over a wide range. Thus these resistor values are easily obtained by using individual components for the resistors $R_i$. For the circuit in FIG. 4, on the other hand, the values of the resistors (FIG. 3, second column from the right) fall for the most part within approximately the same order of magnitude. Since precision resistors having resistance values that differ by only a few percent are relatively expensive, the tree circuit in FIG. 8 is preferable to using individual components for the resistors $R_0$–$R_7$. For the circuit in FIG. 8, the percentage variation in ratios of adjacent resistance values is not significantly changed for normal parts tolerances. The ratio of the effective values of resistances $R'_6$ and $R'_7$ for example, will depart no more than approximately $4\frac{1}{2}\%$ from the design target despite a 5 or 10 percent variation in the value of the 2.2K resistor 63.

Figure 9:
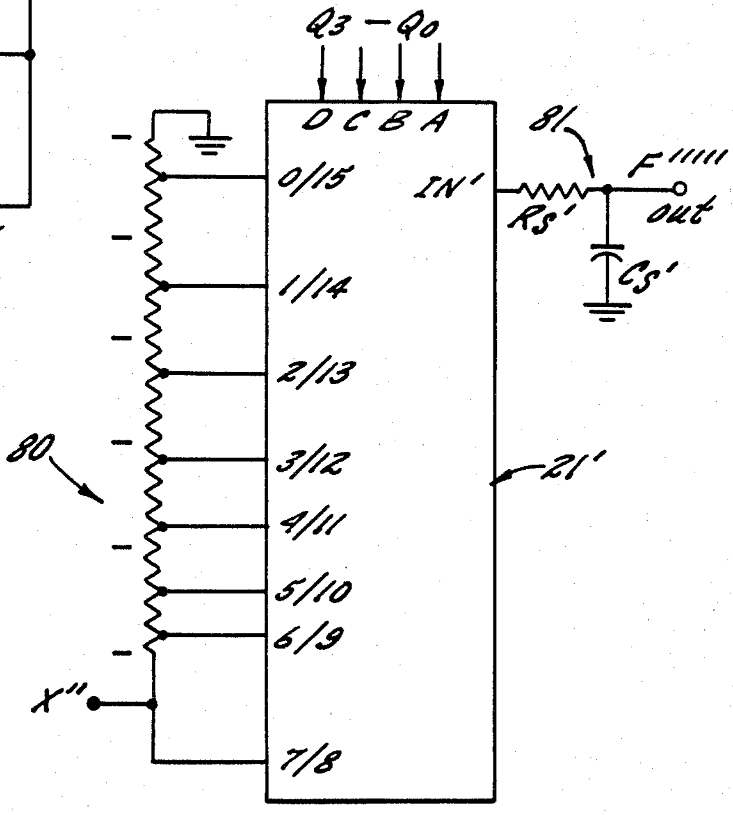
FIG. 9 is a schematic of an embodiment especially adapted for thick or thin film or monolithic integrated circuits in which the attenuator comprises a resistive voltage divider with the physical location of taps having a sinusoidal position variation.

For thick film, thin film, or monolithic integrated resistors, the circuit in FIG. 9 is preferred since the resistors are easily fabricated. In FIG. 9, the resistors comprise a voltage divider generally designated 80 which is excited by the input signal X″ and has sinusoidally-displaced taps. The desired tap is electronically selected by a multiplexer 21′ (connected in a sense "opposite" to that of FIG. 1), the sinusoidal step signal exiting at the terminal IN′. The multiplexer output is filtered by a low-pass filter generally designated 81 so that a smooth output wave form $F''''_{out}$ is obtained. If the circuit in FIG. 9 is integrated, and assuming that it is easier to fabricate OR gates than transmission gates, the multiplexer should have 16 transmission gates activated upon the logical OR of the complementary counter states as shown in FIG. 9.

From the foregoing, it should be realized that the digitally-driven sine/cosine generator and modulator is a basic building block for instrumentation and communication circuits, and the applicant does not intend the scope of the claims to be limited to any particular end use. A few specific applications, however, will be mentioned to confirm that the sine/cosine generator and modulator is in fact a basic building block component.

First, in general instrumentation applications, many transducers preferably have a sinusoidal input and have an output that is amplitude or phase modulated by the parameter being measured. Such transducers range from resolvers in machine control applications to flux-gates for magnetic field measurements, and to various kinds of inductance and capacitance trasducer bridges. In all of these cases, it is desirable to use a digital phase reference, with the reference phase being indicated by a number signaled in binary notation at the output of the counter 20 or the like. This permits a highly stable digital reference to be obtained from a crystal oscillator. It also permits a digital representation of the reference phase to be used either (i) for numerical determination of the trasducer output phase or (ii) for obtaining a reference sinusodial signal of some desired phase offset for a companion digitally-driven sinusoid demodulator for determination of the transducer output amplitude and polarity.

A sinusoidal signal may be obtained by integrating or filtering a digital signal according to prior art methods, but this has the disadvantage that the amplitude and phase of the resulting integrated signal may vary with component tolerances and particularly capacitance variations. The capacitance variations are particularly troublesome at low frequencies where a large capacitance value or high circuit impedance is required in the integrator, and at high frequencies where parasitic capacitance is significant.

Secondly, for communications applications, a digitally-driven sinusoidal generator and modulator may be used for applications where balanced modulators are conventionally employed. The digial drive for the modulator may be obtained from a crystal oscillator or from the divider chain of a phase-locked synthesizer or voltage-controlled oscillator. It should be noted that the balanced modulator is a basic building block for modulators, demodulators and frequency translators. Modulators are basic components, for example, of frequency synthesizers, touch tone generators, modems, and coherent transmitters and receivers. Thus as a detector, balance modulators are typically used in phase-locked loops, tone decoders, and FM and synchronous detectors. Use of the presently-disclosed sinusoidal generator and modulator in a phase-locked loop, for example, permits precise acquisition of a signal buried in wide-band noise and provides a digital representation of the phase of the locked-in signal. For frequency translation and coherent detection circuits such as a Costas loop (Costas, J. P., Synchronous Communication, *Proc. IRE*, Vol. 44 at 1713–18, Dec. 1956), the use of a plurality of applicant's sine wave generators and modulators which are locked into a precise phase arrangement by circuits similar to the circuit shown in FIG. 5, will assure that the phase references are "rock stable". In-phase and quadrature-phase reference oscillators and modulators, for example, are basic to coherent transmission and reception methods such as PRK, MSK, digital spread-spectrum transmission and reception, and multilevel phase-shift modems, and applicant's sine wave generator may be substituted advantageously in such applications.

What is claimed is:

1. A periodically modulating signal generator comprising, in combination, (a) digital signal generating means for producing digital signals representing a phase number which periodically steps through successive numeric values, the digital signal having an alternating most significant bit signal and a less significant portion, (b) digitally-controlled variable-gain analog circuit means having a digital gain control input accepting the less significant portion of the digital signal and an analog input and an analog output, for providing an analog output signal at the analog output that is the signal at the analog input scaled by a predetermined gain factor that is a predetermined function of the number represented by the signal on the digital gain control input, the gain factor being set by a particular gain circuit selected by a corresponding value of the signal on the digital gain control input, and comprising means for cyclically selecting the gain circuits so that at least one of the gain circuits is activated by either of two complementary values of the signal on the digital control input, thereby generating a gain function of the signal on the digital control input that has even symmetry about a value generally between the minimum and maximum values of the less significant portion of the digital signal, and (c) means for exciting the analog input of the digitally-controlled variable-gain analog circuit means, the polarity of the excitation being specified at least in part by the most significant bit signal, so that a periodic analog signal is generated at the analog output of the digitally-controlled variable-gain analog circuit means, the periodic analog signal generally having odd symmetry about the times when the most significant bit signal changes changes its logic state, and even symmetry about times between the times when the most significant bit signal changes its logic state.

2. The combination as claimed in claim 1 wherein the gain of the digitally-controlled variable-gain analog circuit means is generally a sinusoidal function of the less significant portion of the digital signal.

3. The combination as claimed in claim 1 or claim 2 wherein the means for cyclically selecting the gain circuits selects each gain circuit upon occurence of a particular value of the less significant portion of the digital signal and upon the occurrence of a full scale complement of the particular value of the less significant portion of the digital signal.

4. A method for generating a sinusoidal electrical signal having a controlled amplitude and a controlled frequency, comprising the steps of:

(1) generating a periodic digital phase number signal at the controlled frequency, the phase number having a most significant bit and a less significant portion, (2) generating a first analog electrical signal having the controlled amplitude, (3) modulating the polarity of the first analog signal by the most significant bit of the periodic digital signal to thereby generate a second analog signal, and thereafter (4) attenuating said second analog signal with an attenuation gain that is approximately a sinusoidal function of the less significant portion of the periodic digital signal to thereby generate said sinusoidal electrical signal, wherein the numeric values of the less significant portion from zero to one-half full-scale of the numeric value of the less significant portion selects gains corresponding to and ranging over a quarter-cycle phase interval of the sinusoidal function, and wherein the gain selected by each numeric value of the less significant portion from one-half to full-scale is substantially the same as the gain selected by a full-scale complement of the same numeric value of the less significant portion from one-half to full-scale.

5. A sine wave generator comprising, in combination, a digital counter having a digital output, defining a phase number, including a most significant bit output and less significant outputs, the less significant outputs defining a magnitude number, and a clock input, and a digitally-controlled variable attenuator having an attenuator input accepting the most significant bit output signal and further comprising a plurality of gain-setting circuits, each distinct phase specified by the phase number on the digital counter outputs between 0 and 90 degrees having a corresponding gain-setting circuit, the gain for each gain-setting circuit being approximately a sinusoidal function of the corresponding numeric phase, and an analog multiplexer having a digital select input accepting the less significant counter outputs and having analog outputs, each gain-setting circuit being connected to the outputs corresponding to the respective magnitude number specified by the less significant counter output and a full-scale complement of the same respective magnitude number specified by the less significant counter output, so that an approximately sinusoidal wave form appears on the attenuator output when a clock signal is applied to the digital counter, the sinusoidal frequency being a submultiple of the clock frequency.

6. The sine wave generator as claimed in claim 5 wherein the counter is an M bit binary counter, and wherein the analog multiplexer has an M−1 bit binary select input accepting the M−1 least significant output bits from the binary counter, and wherein the analog multiplexer has a common, analog input terminal and $2^{(M-1)}$ output terminals, the output terminals switched to the common input terminal by the M−1 bit magnitude number Z on the multiplexer select input being paired with and connected to corresponding outputs being switched to the common input terminal by the M−1 bit magnitude number $\overline{Z}$, where $\overline{Z}$ designates the 1's complement of the binary number Z, and wherein the paired outputs are connected to $2^{(M-2)}$ gain-setting circuits, the gain-setting circuit values being preselected as a function of the M−1 bit magnitude number Z so that values of Z from 0 to $2^{(M-2)}-1$ select values of approximately sinusoidal attenuation gain G in the attenuator signal path over a quarter-cycle phase interval of 90 degrees, the instantaneous phase $\theta$ in degrees and gain G being a function of Z approximately according to:

$$\theta = \frac{90^\circ (2Z + 1)}{2^{(M-1)}} \text{ and}$$

$$G \propto \sin \theta$$

7. The sine wave generator as claimed in claim 5 further comprising smoothing means connected to the attenuator output for suppression of quantinization noise introduced coincident with changes in the counter outputs.

8. An electrical circuit for multiplying an input analog signal by a sinusoidal function having an instantaneous phase specified by a phase number consisting of a most significant bit and a less significant portion, the less significant portion specifying a magnitude number, comprising, in combination, an analog input accepting the input analog signal, a sinusoid output, and the following elements in series between said input and output, a balanced modulator having an input receiving the most significant bit of the phase number, and a digitally-controlled variable attenuator comprising a plurality of gain-setting circuits, each gain-setting circuit corresponding to a numeric phase value between 0 and 90 degrees, and having a gain that is approximately a sinusoidal function of the respective numeric phase value, and said variable attenuator including an analog multiplexer having a digital select input accepting the less significant portion of the phase number and having analog outputs, each gain-setting circuit being connected to the outputs corresponding to the respective magnitude number and a full scale complement of the respective magnitude number.

9. The electrical circuit as claimed in claim 8 further comprising a digital counter having a digital output including a most significant bit output and less significant bit outputs providing the most significant bit and the less significant portion of the phase number, respectively, and a clock input, so that a sine wave at a submultiple of the clock input frequency having an amplitude controlled by the analog input signal is generated on the sinusoid output.

10. The electrical circuit as claimed in claim 8 or claim 9 wherein the balanced modulator is a switching modulator.

11. The electrical circuit as claimed in claim 8 or claim 9 wherein the phase number is an M bit binary number and wherein the analog multiplexer has a common analog input terminal and $2^{(M-1)}$ output terminals, the output terminals being switched to the common input terminal by both the M−1 less significant bits on the multiplexer select input specifying the magnitude number Z and by the M−1 less significant bits specifying the magnitude number $\overline{Z}$ where $\overline{Z}$ designates the 1's complement of Z, and wherein the outputs are individually connected to $2^{(M-2)}$ gain-setting circuits, the gain values of the gain-setting circuits being predetermined as a function of the magnitude number Z so that values of Z from 0 to $2^{(M-2)}-1$ select values of approximately sinusoidally weighted attenuation gain G over a quarter-cycle phase interval of 90 degrees, the instantaneous phase $\theta$ in degrees and gain G being a function of Z approximately according to:

$$\theta = \frac{90^\circ (2Z + 1)}{2^{(M-1)}} \text{ and}$$

$$G \propto \sin\theta$$

12. The electrical circuit as claimed in claim 8 or claim 9 further comprising smoothing means connected to the attenuator output for suppression of quantinization noise introduced coincident with changes in the phase number.

13. The electrical circuit as claimed in claim 8 or claim 9 further comprising integrator means accepting the sinusoid output signal for generating a quadrature output signal phase-shifted by approximately 90 degrees.

14. The electrical circuit as claimed in claim 9 wherein the digital counter has a reset input, so that a zero phase time may be established by activation of the reset input.

* * * * *